US010468207B2

(12) United States Patent
Guo

(10) Patent No.: US 10,468,207 B2
(45) Date of Patent: Nov. 5, 2019

(54) ARC-EXTINGUISHING POWER DEVICE DRIVING APPARATUS AND ARC EXTINGUISHING APPARATUS

(71) Applicant: Qiaoshi Guo, Guangdong (CN)

(72) Inventor: Qiaoshi Guo, Guangdong (CN)

(73) Assignee: Qiaoshi Guo, Guangdong (CN)

( * ) Notice: Subject to any disclaimer, the term of this patent is extended or adjusted under 35 U.S.C. 154(b) by 0 days.

(21) Appl. No.: 16/072,142

(22) PCT Filed: Jan. 20, 2017

(86) PCT No.: PCT/CN2017/071791
§ 371 (c)(1),
(2) Date: Jul. 23, 2018

(87) PCT Pub. No.: WO2017/125054
PCT Pub. Date: Jul. 27, 2017

(65) Prior Publication Data
US 2019/0035571 A1    Jan. 31, 2019

(30) Foreign Application Priority Data

Jan. 24, 2016  (CN) .......................... 2016 1 0070145
Feb. 26, 2016  (CN) .......................... 2016 1 0116841
(Continued)

(51) Int. Cl.
| | |
|---|---|
| *H01H 9/54* | (2006.01) |
| *H01H 9/30* | (2006.01) |
| *G01R 19/22* | (2006.01) |
| *H01H 47/24* | (2006.01) |
| *H03K 17/51* | (2006.01) |

(52) U.S. Cl.
CPC ............. *H01H 9/542* (2013.01); *G01R 19/22* (2013.01); *H01H 9/30* (2013.01); *H01H 47/24* (2013.01);
(Continued)

(58) Field of Classification Search
USPC ....................................................... 361/2–13
See application file for complete search history.

(56) References Cited

U.S. PATENT DOCUMENTS 5,703,743 A * 12/1997 Lee .......................... H01H 9/542
361/4
6,621,668 B1 * 9/2003 Sare ........................ H01H 9/542
361/13
(Continued)

FOREIGN PATENT DOCUMENTS

CN    102323472 A    1/2012
CN    103035445 A    4/2013
(Continued)

OTHER PUBLICATIONS

PCT/CN2017/071791, dated May 3, 2017, International Search Report and Written Opinion.
(Continued)

*Primary Examiner* — Danny Nguyen
(74) *Attorney, Agent, or Firm* — Wolf, Greenfield & Sacks, P.C.

(57) ABSTRACT

An arc extinguishing power device driving apparatus and an arc extinguishing apparatus of the present disclosure belong to the electrical field, and are particularly an arc extinguishing power device driving apparatus applicable to an electronic arc extinguishing apparatus for driving a power device. The power device that needs to be driven is connected in parallel to a mechanical switch that requires arc extinguishing, and includes a first voltage detection switch. An input end of the first voltage detection switch is connected to two ends of the power device. The first voltage detection switch is connected in series in a driving loop of the power device. The first voltage detection switch is turned on when detecting that there is a potential difference between the two ends of the power device. A driving signal
(Continued)

is transferred to the power device by using the first voltage detection switch, to drive the power device to be turned on. The first voltage detection switch is a semi-controllable switch, or a fully-controllable switch whose threshold is less than an on-state voltage of the power device. The present disclosure has advantages of no need of a semiconductor device with a high withstand voltage, real-time detection on disconnection of a mechanical switch, and low driving energy consumption.

46 Claims, 9 Drawing Sheets

(30) Foreign Application Priority Data

| Mar. 2, 2016 | (CN) | 2016 1 0133080 |
| Mar. 18, 2016 | (CN) | 2016 1 0176973 |
| May 3, 2016 | (CN) | 2016 1 0307735 |
| May 22, 2016 | (CN) | 2016 1 0392525 |
| Jun. 2, 2016 | (CN) | 2016 1 0403426 |
| Oct. 26, 2016 | (CN) | 2016 1 0946077 |
| Oct. 29, 2016 | (CN) | 2016 1 0923032 |
| Jan. 16, 2017 | (CN) | 2017 1 0029448 |

(52) U.S. Cl.
CPC ............ *H03K 17/51* (2013.01); *H01H 9/541* (2013.01); *H01H 2009/543* (2013.01); *H01H 2009/544* (2013.01); *H01H 2009/545* (2013.01)

(56) References Cited

U.S. PATENT DOCUMENTS

| 2004/0165322 A1* | 8/2004 | Crawford | H01H 9/542 361/2 |
| 2010/0007997 A1* | 1/2010 | Kao | H01H 9/542 361/13 |
| 2011/0222191 A1* | 9/2011 | Henke | H01H 9/542 361/2 |

FOREIGN PATENT DOCUMENTS

| CN | 103325591 A | 9/2013 |
| CN | 104392860 A | 3/2015 |
| CN | 104465167 A | 3/2015 |
| JP | S6-1153905 A | 7/1986 |

OTHER PUBLICATIONS

Chinese Office Action for Chinese Application No. 201710029448.X dated Oct. 30, 2017.
Chinese Office Action for Chinese Application No. 201710029448.X dated Jan. 26, 2018.
Chinese Decision to Grant for Chinese Application No. 201710029448.X dated Apr. 10, 2018.
International Search Report and Written Opinion for International Application No. PCT/CN2017/071791 dated May 3, 2017.
201710029448.X, dated Oct. 30, 2017, First Office Action.
201710029448.X, dated Jan. 26, 2018, Second Office Action.
201710029448.X, dated Apr. 10, 2018, Decision to Grant.

* cited by examiner

ARC-EXTINGUISHING POWER DEVICE DRIVING APPARATUS AND ARC EXTINGUISHING APPARATUS

RELATED APPLICATIONS

This application is a 35 U.S.C. § 371 national stage filing of International Application No. PCT/CN2017/071791, filed on Jan. 20, 2017, which claims priority to Chinese Patent Application No. 201610070145.8, filed on Jan. 24, 2016, No. 201610116841.8, filed on Feb. 26, 2016, No. 201610133080.7, filed on Mar. 2, 2016, No. 201610176973.X, filed on Mar. 18, 2016, No. 201610307735.8, filed on May 3, 2016, No. 201610392525.3, filed on May 22, 2016, No. 201610403426.0, filed on Jun. 2, 2016, No. 201610946077.7, filed on Oct. 26, 2016, No. 201610923032.8, filed on Oct. 29, 2016, and No. 201710029448.X, filed on Jan. 16, 2017. The entire contents of each of the foregoing applications are incorporated herein by reference.

TECHNICAL FIELD

An arc extinguishing power device driving apparatus and an arc extinguishing apparatus of the present disclosure belong to the electrical field, and are particularly an arc extinguishing power device driving apparatus applicable to an electronic arc extinguishing apparatus of a mechanical switch for driving a power device, and an arc extinguishing apparatus used for arc extinguishing for a mechanical switch.

BACKGROUND

Currently, in an electric control system, when a mechanical switch such as a relay controls breaking of load, a breaking electric arc is large, and there is a disadvantage that an electrical life of the mechanical switch is quite short. Therefore, an electronic arc extinguishing apparatus based on a parallel connection between a power device and a mechanical switch emerges, for example, a patent with Chinese Patent Application No. CN01201907.0 and entitled "ELECTRONIC ARC EXTINGUISHER" and a patent with Chinese Patent Application No. CN200910306608.6 and entitled "OPTOCOUPLER-BASED HYBRID AC PASSIVE CONTACTOR SWITCH DRIVING CONTROLLER". As disclosed in the two patents, a manner of connecting a thyristor (a power device) and a mechanical contactor switch in parallel is used; a control circuit is connected to a control coil of a contactor; before the mechanical contactor switch is broken, a control signal that controls conduction of the thyristor is provided; when the control coil of the contactor encounters a power loss and the mechanical switch is disconnected, the thyristor is turned on, and a filter capacitor of the control circuit discharges to delay disconnecting the control signal for turning on the thyristor; and then the thyristor is turned off, to complete an electric arc-free breaking process.

The foregoing electronic arc extinguishing apparatus has the following disadvantages:

Before the mechanical contactor switch is disconnected, the control circuit needs to provide the control signal that controls conduction of the thyristor in advance.

A driving signal of the thyristor (the power device) is provided by a main loop of the thyristor by using a semiconductor switch, where the semiconductor switch has a high voltage withstand requirement and low reliability, and is prone to breakdown.

SUMMARY

An objective of the present disclosure is to provide, against disadvantages of an existing electronic arc extinguishing power device driving apparatus, a cost-effective arc extinguishing power device driving apparatus and arc extinguishing apparatus that have low voltage withstand requirement and that can detect disconnection of a mechanical switch in real time. To achieve the objective of the present disclosure, the present disclosure describes an arc extinguishing power device driving apparatus, wherein a power device that needs to be driven is connected in parallel to a mechanical switch that requires arc extinguishing, and the arc extinguishing power device driving apparatus comprises a first voltage detection switch, wherein an input end of the first voltage detection switch is connected to two ends of the power device; the first voltage detection switch is connected in series in a driving loop of the power device; the first voltage detection switch is turned on when detecting that there is a potential difference between the two ends of the power device; a driving signal is transferred to the power device by using the first voltage detection switch, to drive the power device to be turned on; and the first voltage detection switch is a semi-controllable switch, or a fully-controllable switch whose threshold is less than an on-state voltage of the power device.

In the arc extinguishing power device driving apparatus, there is no insulated isolation between an input loop of the first voltage detection switch, an output loop of the first voltage detection switch, and the power device.

In the arc extinguishing power device driving apparatus, the first voltage detection switch comprises a second current limiting element and a semiconductor switch, a potential difference signal between the two ends of the power device is transferred to a control end of the semiconductor switch by using the second current limiting element, the semiconductor switch is connected in series in the driving loop, and the second current limiting element is a resistor or a capacitor.

In the arc extinguishing power device driving apparatus, the semiconductor switch is a circuit of a transistor-driven thyristor equivalent circuit, or a thyristor equivalent circuit, or a thyristor. In the arc extinguishing power device driving apparatus, the thyristor equivalent circuit or the thyristor is connected in series in the driving loop.

In the arc extinguishing power device driving apparatus, the thyristor equivalent circuit comprises a PNP transistor and an NPN transistor, a base of the PNP transistor is connected to a collector of the NPN transistor, a collector of the PNP transistor is connected to a base of the NPN transistor, and an emitter of the PNP transistor and an emitter of the NPN transistor are connected in series in the driving loop.

In the arc extinguishing power device driving apparatus, a first capacitor is comprised, wherein a control end of the first voltage detection switch is connected to a first end of the power device; the first capacitor, the first voltage detection switch, and a second end and a third end of the power device form the driving loop; and the first capacitor is connected to a switch configured to recharge the first capacitor or a first current limiting element.

In the arc extinguishing power device driving apparatus, the first voltage detection switch discharges the first capacitor to a minimum conduction current of the first voltage detection switch.

In the arc extinguishing power device driving apparatus, the power device is a unidirectional thyristor or a bidirectional thyristor, and a unidirectional conduction device and a first voltage regulator are further comprised; the first current limiting element, the unidirectional conduction device, and the first capacitor are connected in series to form a series circuit; one end of the series circuit is connected to a power supply, and the other end of the series circuit is connected to the third end of the power device; the first capacitor, the first voltage detection switch, the second end of the power device, and the third end of the power device form the driving loop; and the first voltage regulator is connected in parallel to the first capacitor, or the first voltage regulator is connected in parallel to the first capacitor by using the unidirectional conduction device.

In the arc extinguishing power device driving apparatus, the first voltage detection switch is a full-wave voltage detection circuit.

In the arc extinguishing power device driving apparatus, the power supply is provided in a non-isolated manner by a power grid in which the power device is located.

In the arc extinguishing power device driving apparatus, the power supply is a neutral line or another phase power supply relative to the third end of the power device.

The present disclosure further describes an arc extinguishing apparatus, comprising any of the foregoing the arc extinguishing power device driving apparatus, and further comprising the power device, a first pin, a second pin, and a third pin, wherein the arc extinguishing power device driving apparatus and the power device are packaged in an insulating material, the first pin and the second pin are respectively connected to the first end of the power device and the third end of the power device, and the third pin is connected to an end of the first current limiting element in the series circuit.

In the arc extinguishing power device driving apparatus, a second capacitor and a first photoelectric switch are further comprised, wherein the first voltage detection switch is a voltage zero-crossing detection switch; the first capacitor, the first photoelectric switch, the first voltage detection switch, the second end of the power device, and the third end of the power device form the driving loop; before the mechanical switch is closed, the first photoelectric switch is turned on, and an electric charge of the first capacitor stores energy for the second capacitor by using the first photoelectric switch; when the first voltage detection switch is turned on, the electric charge of the first capacitor drives, by using the first photoelectric switch and the first voltage detection switch, the power device to be turned on; then the mechanical switch is closed, and the first voltage detection switch is turned off; and when the mechanical switch is broken, the first photoelectric switch is turned off, the first voltage detection switch is turned on, and the second capacitor drives, by using the first voltage detection switch, the power device to be turned on.

In the arc extinguishing power device driving apparatus, a control end of the first photoelectric switch is connected to a control end of the mechanical switch by using a current limiting element.

In the arc extinguishing power device driving apparatus, a second photoelectric switch is comprised, wherein the second photoelectric switch is an optocoupler with thyristor output or an optocoupler-driven thyristor equivalent circuit, a control end of the second photoelectric switch is connected to the first voltage detection switch, and an output end of the second photoelectric switch is connected in series to a control coil of the mechanical switch.

In the arc extinguishing power device driving apparatus, the power device is a thyristor; the first voltage detection switch comprises a second current limiting element, a first transistor, a second transistor, a third transistor, and a fourth transistor; an emitter of the second transistor is connected to a base of the third transistor; a base of the second transistor is connected to an emitter of the third transistor; a collector of the second transistor is connected to a base of the first transistor; a base of the fourth transistor is connected to a collector of the third transistor; a collector of the fourth transistor is connected to the emitter of the second transistor; an emitter of the fourth transistor is connected to the base of the first transistor; the base of the second transistor is connected to a first end of the power device by using the second current limiting element; the emitter of the second transistor is connected to a third end of the power device; and an emitter of the first transistor and a collector of the first transistor are connected in series in the driving loop.

In the arc extinguishing power device driving apparatus, a fifth transistor is further comprised, wherein a base of the fifth transistor is connected to the collector of the first transistor, a collector of the fifth transistor is connected to the base of the first transistor, and an emitter of the fifth transistor is connected in series in the driving loop.

In the arc extinguishing power device driving apparatus, the power device is a thyristor; the first voltage detection switch comprises a second current limiting element, a first transistor, a second transistor, a third transistor, and a fourth transistor; an emitter of the second transistor is connected to a base of the third transistor; a base of the second transistor is connected to an emitter of the third transistor; a collector of the second transistor is connected to a base of the first transistor; a base of the fourth transistor is connected to a collector of the third transistor; a collector of the fourth transistor is connected to the emitter of the second transistor; an emitter of the fourth transistor is connected to the base of the first transistor; the base of the second transistor is connected to a first end of the power device by using the second current limiting element; a collector of the first transistor is connected to the base of the second transistor; the emitter of the second transistor is connected to a second end of the power device; and an emitter of the first transistor and the emitter of the second transistor are connected in series in the driving loop of the power device.

In the arc extinguishing power device driving apparatus, a second voltage detection switch is further comprised, wherein the first voltage detection switch, a second end of the power device, and a third end of the power device form the driving loop of the power device; a control end of the first voltage detection switch is connected to a first end of the power device; and two ends of the second voltage detection switch are respectively connected to the second end of the power device and the third end of the power device.

In the arc extinguishing power device driving apparatus, the second voltage detection switch and the first voltage detection switch are connected in series to form a first series circuit, and a control end of the second voltage detection switch is connected to an end of the first voltage detection switch in the first series circuit.

In the arc extinguishing power device driving apparatus, the second voltage detection switch is turned on when a voltage of the driving signal cannot satisfy saturated conduction of the power device.

In the arc extinguishing power device driving apparatus, the second voltage detection switch comprises a resistor and a transistor.

In the arc extinguishing power device driving apparatus, the second voltage detection switch comprises a third voltage regulator, a sixth transistor, a seventh transistor, an eleventh resistor, a twelfth resistor, and a thirteenth resistor; a collector of the sixth transistor is connected to a base of the seventh transistor; the collector of the sixth transistor is connected to a collector of the seventh transistor by using the twelfth resistor; the collector of the seventh transistor and an emitter of the seventh transistor are a main loop end of the second voltage detection switch; the thirteenth resistor, the third voltage regulator, a base of the sixth transistor, and an emitter of the sixth transistor are connected in series to form a fourth series circuit; the fourth series circuit is connected in parallel to a first capacitor; two ends of the eleventh resistor are respectively connected to the base of the sixth transistor and the emitter of the sixth transistor; and the emitter of the sixth transistor is connected to the emitter of the seventh transistor.

In the arc extinguishing power device driving apparatus, the second voltage detection switch comprises a third voltage regulator, a sixth transistor, a seventh transistor, an eleventh resistor, a twelfth resistor, a thirteenth resistor, and a fourth capacitor; a collector of the sixth transistor is connected to a base of the seventh transistor; the collector of the sixth transistor is connected to a collector of the seventh transistor by using the twelfth resistor; the collector of the seventh transistor and an emitter of the seventh transistor are a main loop end of the second voltage detection switch; the thirteenth resistor, the third voltage regulator, a base of the sixth transistor, and an emitter of the sixth transistor are connected in series to form a series circuit; the series circuit is connected in parallel to the main loop end of the second voltage detection switch; two ends of the eleventh resistor are respectively connected to the base of the sixth transistor and the emitter of the sixth transistor; the emitter of the sixth transistor is connected to the emitter of the seventh transistor; and two ends of the fourth capacitor are respectively connected to the base of the seventh transistor and the emitter of the seventh transistor.

In the arc extinguishing power device driving apparatus, a first semiconductor switch, a first current limiting element, and a first capacitor are comprised, wherein the first semiconductor switch, the first capacitor, and the first current limiting element are sequentially connected in series to form a second series circuit; the second series circuit is connected in parallel to load of the mechanical switch; an end of the first semiconductor switch in the second series circuit is connected to the third end of the power device; a common end of the first semiconductor switch and the first capacitor is connected to the second end of the power device; and a third series circuit formed by the first semiconductor switch and the first capacitor that are connected in series is connected in parallel to the first voltage detection switch.

In the arc extinguishing power device driving apparatus, a first voltage regulator is comprised, wherein the first voltage regulator is connected in parallel to the first capacitor, or the first voltage regulator is connected in parallel to the first capacitor by using the first semiconductor switch.

In the arc extinguishing power device driving apparatus, the first semiconductor switch is a diode, a cathode of the diode is connected to the first capacitor, and the power device is used for direct current arc extinguishing.

In the arc extinguishing power device driving apparatus, the first voltage detection switch comprises a trigger switch, a transistor, and a third capacitor; the trigger switch is connected in parallel to the third series circuit; a potential difference signal between the third end of the power device and the first end of the power device is amplified by the third capacitor and the transistor and then transferred to a trigger of the trigger switch.

In the arc extinguishing power device driving apparatus, the trigger switch is a thyristor or a thyristor equivalent circuit.

The present disclosure further describes an arc extinguishing apparatus, comprising any of the foregoing arc extinguishing power device driving apparatus, and further comprising the power device, a first pin, a second pin, and a third pin, wherein the arc extinguishing power device driving apparatus and the power device are packaged in an insulating material, the first pin and the second pin are respectively connected to the first end of the power device and the third end of the power device, and the third pin is connected to an end of the first current limiting element in the second series circuit.

In the arc extinguishing power device driving apparatus, an optocoupler is further comprised, wherein the optocoupler is configured to enable the first voltage detection switch, and a control end of the optocoupler is connected to a control end of the mechanical switch.

The present disclosure further describes an arc extinguishing apparatus, comprising any of the foregoing arc extinguishing power device driving apparatus, and further comprising the power device, a first pin, a second pin, a third pin, a fourth pin, and a fifth pin, wherein the optocoupler, the arc extinguishing power device driving apparatus, and the power device are packaged in an insulating material; the first pin and the second pin are respectively connected to the first end of the power device and the third end of the power device; the third pin is connected to an end of the first current limiting element in the second series circuit; and the fourth pin and the fifth pin are connected to the control end of the optocoupler.

In the arc extinguishing power device driving apparatus, a control unit, a first optocoupler, and a second optocoupler are further comprised, wherein an output end of the first optocoupler and a control end of the second optocoupler are connected to the first voltage detection switch, an output signal of the second optocoupler is connected to the control unit, and a control end of the first optocoupler is connected to the control unit.

In the arc extinguishing power device driving apparatus, the power device is a voltage-controlled device.

In the arc extinguishing power device driving apparatus, the power device is a field-effect transistor or an IGBT.

In the arc extinguishing power device driving apparatus, the power device is used for direct current arc extinguishing, and a first semiconductor switch, a first current limiting element, and a first capacitor are further comprised; the first semiconductor switch, the first capacitor, and the first current limiting element are sequentially connected in series to form a second series circuit; the second series circuit is connected in parallel to load of the mechanical switch; an end of the first semiconductor switch in the second series circuit is connected to a third end of the power device; a common end of the first semiconductor switch and the first capacitor is connected to a second end of the power device; and a third series circuit formed by the first semiconductor switch and the first capacitor that are connected in series is connected in parallel to the first voltage detection switch.

In the arc extinguishing power device driving apparatus, the first voltage detection switch comprises a trigger switch, a transistor, and a third capacitor; the trigger switch is connected in parallel to the third series circuit; a potential difference signal between the third end of the power device and a first end of the power device is amplified by the third capacitor and the transistor and then transferred to a trigger of the trigger switch.

In the arc extinguishing power device driving apparatus, the trigger switch is a thyristor or a thyristor equivalent circuit.

In the arc extinguishing power device driving apparatus, the first semiconductor switch is a diode, and a cathode of the diode is connected to the first capacitor.

In the arc extinguishing power device driving apparatus, a first voltage regulator is comprised, wherein the first voltage regulator is connected in parallel to the first capacitor, or the first voltage regulator is connected in parallel to the first capacitor by using the first semiconductor switch.

In the arc extinguishing power device driving apparatus, a second voltage detection switch is further comprised, wherein the first voltage detection switch, the second end of the power device, and the third end of the power device form the driving loop of the power device;
a control end of the first voltage detection switch is connected to a first end of the power device; and
two ends of the second voltage detection switch are respectively connected to the second end of the power device and the third end of the power device, and the second voltage detection switch is turned on when a voltage of the driving signal cannot satisfy saturated conduction of the power device.

In the arc extinguishing power device driving apparatus, the power device is a voltage-controlled device.

In the arc extinguishing power device driving apparatus, the power device is a field-effect transistor or an IGBT.

The present disclosure further describes an arc extinguishing apparatus, comprising any of the foregoing arc extinguishing power device driving apparatus, and further comprising the power device, a first pin, a second pin, and a third pin, wherein the arc extinguishing power device driving apparatus and the power device are packaged in an insulating material, the first pin and the second pin are respectively connected to the first end of the power device and the third end of the power device, and the third pin is connected to an end of the first current limiting element in the second series circuit.

In the arc extinguishing power device driving apparatus, an optocoupler is further comprised, wherein the optocoupler is configured to enable the first voltage detection switch, and a control end of the optocoupler is connected to a control end of the mechanical switch.

The present disclosure further describes an arc extinguishing apparatus, comprising the arc extinguishing power device driving apparatus, and further comprising the power device, a first pin, a second pin, a third pin, a fourth pin, and a fifth pin, wherein the optocoupler, the arc extinguishing power device driving apparatus, and the power device are packaged in an insulating material; the first pin and the second pin are respectively connected to the first end of the power device and the third end of the power device; the third pin is connected to an end of the first current limiting element in the second series circuit; and the fourth pin and the fifth pin are connected to the control end of the optocoupler.

An arc extinguishing power device driving apparatus is provided, as shown in FIG. 1, where a power device TR1 that needs to be driven is connected in parallel to a mechanical switch K1 that requires arc extinguishing, and includes a first voltage detection switch (A1), where an input end of the first voltage detection switch (A1) is connected to two ends of the power device TR1; the first voltage detection switch (A1) is connected in series in a driving loop of the power device TR1; the first voltage detection switch (A1) is turned on when detecting that there is a potential difference between the two ends of the power device TR1; a driving signal is transferred to the power device TR1 by using the first voltage detection switch (A1), to drive the power device TR1 to be turned on; and the first voltage detection switch (A1) is a semi-controllable switch, or a fully-controllable switch whose threshold is less than an on-state voltage of the power device TR1.

Working principle: The driving signal is input at a P4 end. When the mechanical switch K1 is in a closed state, the first voltage detection switch (A1) is turned off. The first voltage detection switch (A1) is turned on when detecting that there is the potential difference between the two ends of the power device TR1 (in other words, is turned on when detecting disconnection of the mechanical switch K1 in real time). The driving signal is transferred to the power device TR1 by using the first voltage detection switch (A1), to drive the power device TR1 to be turned on, thereby achieving an objective of arc extinguishing by driving conduction of the power device TR1 in real time. Driving energy does not need to be provided in advance, thereby reducing working energy required by the driving signal. Herein, a semi-controllable switch, or a fully-controllable switch whose threshold is less than the on-state voltage of the power device TR1 may be used as the first voltage detection switch (A1).

The present disclosure has an appropriate design. The present disclosure has advantages of no need of a semiconductor device with a high withstand voltage, real-time detection on disconnection of a mechanical switch, and low driving energy consumption.

DESCRIPTION OF EMBODIMENTS

Figure 1:
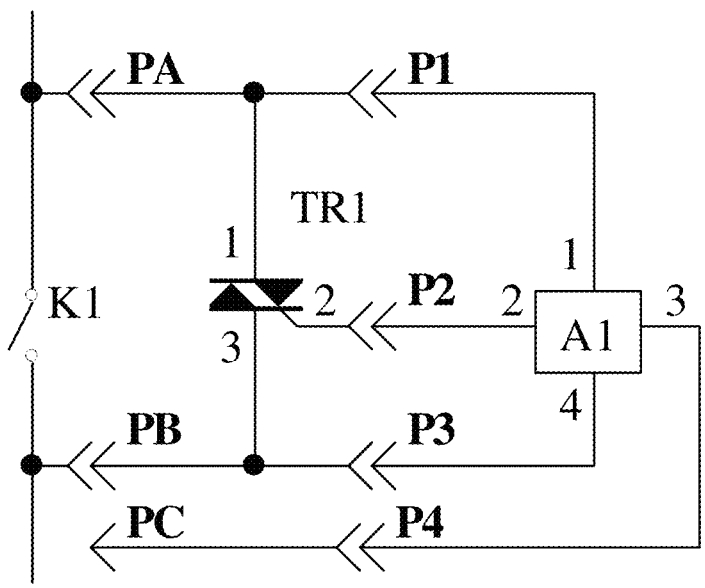
FIG. 1 is a schematic diagram of a circuit of an arc extinguishing power device driving apparatus according to the present disclosure.
Figure 2:
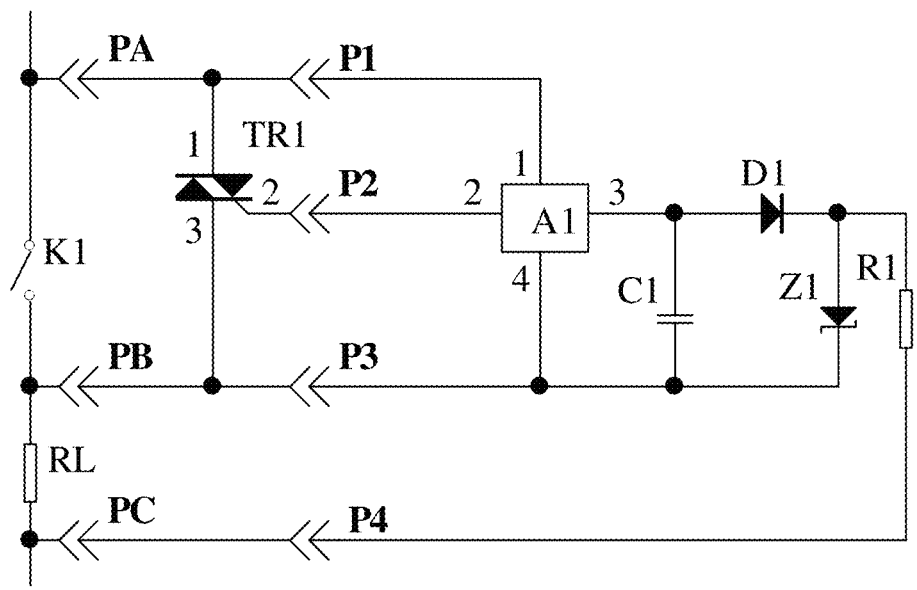
FIG. 2 is a schematic diagram 1 of a circuit of Embodiment 1 of an arc extinguishing power device driving apparatus and an arc extinguishing apparatus according to the present disclosure.

Embodiment 1 of an arc extinguishing power device driving apparatus of the present disclosure is shown in FIG. 2:

An arc extinguishing power device driving apparatus is provided, where a power device TR1 (a bidirectional thyristor) that needs to be driven is connected in parallel to a mechanical switch K1 that requires arc extinguishing, and includes a first voltage detection switch (A1), a first current limiting element R1 (a resistor), a first capacitor C1, a unidirectional conduction device D1 (a diode), and a first voltage regulator Z1 (a voltage regulation diode), where a control end of the first voltage detection switch (A1) is connected to a first end (a second anode) of the power device TR1; the first current limiting element R1, the unidirectional conduction device D1, and the first capacitor C1 are connected in series to form a series circuit; one end of the series circuit is connected to a power supply (the power supply may be a neutral line or another phase power supply relative to a third end of the power device TR1), and the other end of the series circuit is connected to the third end (a first anode) of the power device TR1; the first capacitor C1, the first voltage detection switch (A1), a second end (a trigger) of the power device TR1, and the third end of the power device TR1 form a driving loop; and the first voltage regulator Z1 is connected in parallel to the first capacitor C1 by using the unidirectional conduction device D1 (or the first voltage regulator Z1 may be directly connected in parallel to the first capacitor C1, but a voltage withstand requirement for the unidirectional conduction device D1 needs to be improved).

Figure 3:
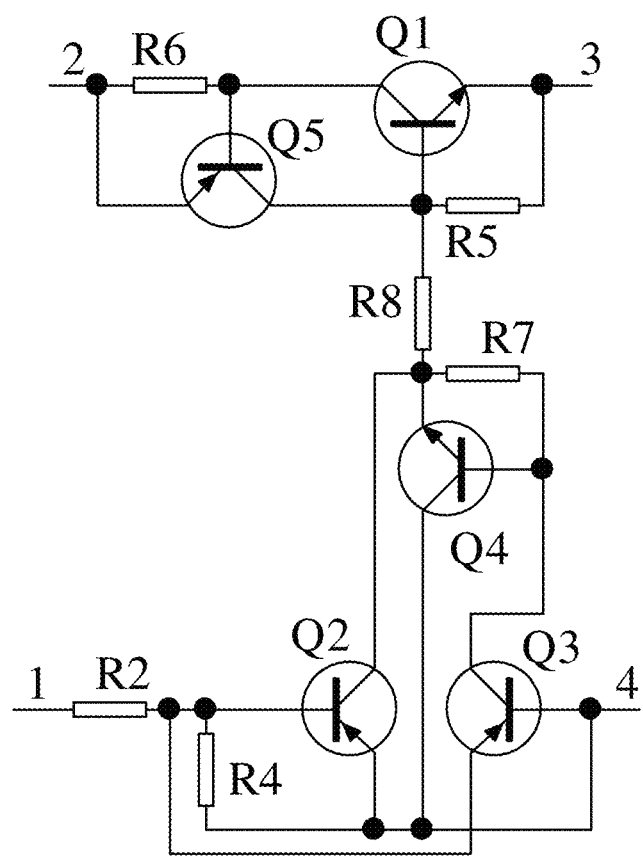
FIG. 3 is a schematic diagram 1 of a circuit of a first voltage detection switch of an arc extinguishing power device driving apparatus according to the present disclosure.
Figure 4:
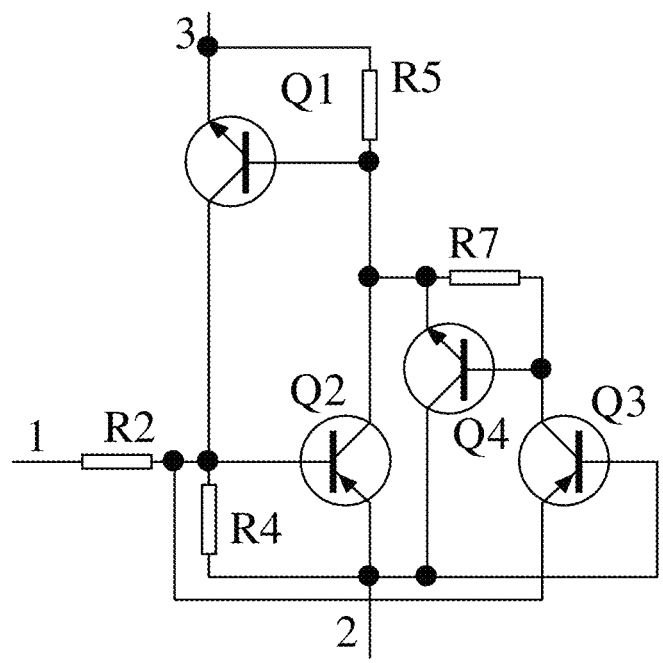
FIG. 4 is a schematic diagram 2 of a circuit of a first voltage detection switch of an arc extinguishing power device driving apparatus according to the present disclosure.

The first voltage detection switch (A1) may be selected according to a circuit shown in FIG. 3 or FIG. 4:

As shown in FIG. 3, the first voltage detection switch (A1) is a four-end circuit, and is a full-wave voltage detection circuit. The first voltage detection switch (A1) is a semi-controllable switch (or is a fully-controllable switch whose threshold is less than an on-state voltage of the power device TR1 when a fifth transistor Q5 is omitted). The first voltage detection switch (A1) includes a second current limiting element R2 (a resistor), a first transistor Q1, a second transistor Q2, a third transistor Q3, a fourth transistor Q4, the fifth transistor Q5, a fourth resistor R4, a fifth resistor R5, a sixth resistor R6, a seventh resistor R7, and an eighth resistor R8. An emitter of the second transistor Q2 is connected to a base of the third transistor Q3. A base of the second transistor Q2 is connected to an emitter of the third transistor Q3. A collector of the second transistor Q2 is connected to a base of the first transistor Q1. A base of the fourth transistor Q4 is connected to a collector of the third transistor Q3. A collector of the fourth transistor Q4 is connected to the emitter of the second transistor Q2. An emitter of the fourth transistor Q4 is connected to the base of the first transistor Q1. The base of the second transistor Q2 is connected to the first end of the power device TR1 by using the second current limiting element R2. The emitter of the second transistor Q2 is connected to the third end of the power device TR1. An emitter of the first transistor Q1 and a collector of the first transistor Q1 are connected in series in the driving loop of the power device TR1. A base of the fifth transistor Q5 is connected to the collector of the first transistor Q1. A collector of the fifth transistor Q5 is connected to the base of the first transistor Q1. An emitter of the fifth transistor Q5 is connected in series in the driving loop of the power device TR1. Two ends of the fourth resistor R4 are respectively connected to the base of the second transistor Q2 and the emitter of the second transistor Q2. Two ends of the fifth resistor R5 are respectively connected to the base of the first transistor Q1 and the emitter of the first transistor Q1. Two ends of the sixth resistor R6 are respectively connected to the base of the fifth transistor Q5 and the emitter of the fifth transistor Q5. Two ends of the seventh resistor R7 are respectively connected to the base of the fourth transistor Q4 and the emitter of the fourth transistor Q4. The eighth resistor R8 is used for current limiting. The fourth resistor R4, the fifth resistor R5, the sixth resistor R6, the seventh resistor R7, and the eighth resistor R8 are used depending on a requirement. The first voltage detection switch (A1) includes the second current limiting element R2 (a resistor or a capacitor) and a semiconductor switch (a transistor circuit shown in FIG. 3, or a bidirectional thyristor, or a transistor circuit shown in FIG. 4). A potential difference signal between two ends of the power device TR1 is transferred to a control end of the semiconductor switch by using the second current limiting element R2. The semiconductor switch is connected in series in the driving loop. A circuit formed by the first transistor Q1, the second transistor Q2, the third transistor Q3, the fourth transistor Q4, and the fifth transistor Q5 that are connected is a circuit of a transistor-driven thyristor equivalent circuit. A thyristor equivalent circuit formed by the first transistor Q1 (an NPN transistor) and the fifth transistor Q5 (a PNP transistor) that are connected is connected in series in the driving loop of the power device TR1.

As shown in FIG. 4, the first voltage detection switch (A1) is a three-end circuit, and is a full-wave voltage detection circuit, and includes a second current limiting element R2 (a resistor), a first transistor Q1, a second transistor Q2, a third transistor Q3, a fourth transistor Q4, a fourth resistor R4, a fifth resistor R5, and a seventh resistor R7. An emitter of the second transistor Q2 is connected to a base of the third transistor Q3. A base of the second transistor Q2 is connected to an emitter of the third transistor Q3. A collector of the second transistor Q2 is connected to a base of the first transistor Q1. A base of the fourth transistor Q4 is connected to a collector of the third transistor Q3. A collector of the fourth transistor Q4 is connected to the emitter of the second transistor Q2. An emitter of the fourth transistor Q4 is connected to the base of the first transistor Q1. The base of the second transistor Q2 is connected to the first end of the power device TR1 by using the second current limiting element R2. A collector of the first transistor Q1 is connected to the base of the second transistor Q2. The emitter of the second transistor Q2 is connected to the second end of the power device TR1. An emitter of the first transistor Q1 and the emitter of the second transistor Q2 are connected in series in the driving loop of the power device TR1. Two ends of the fourth resistor R4 are respectively connected to the base of the second transistor Q2 and the emitter of the second transistor Q2. Two ends of the fifth resistor R5 are respectively connected to the base of the first transistor Q1 and the emitter of the first transistor Q1. Two ends of the seventh resistor R7 are respectively connected to the base of the fourth transistor Q4 and the emitter of the fourth transistor Q4. The fourth resistor R4, the fifth resistor R5, and the seventh resistor R7 are used depending on a requirement. A thyristor equivalent circuit formed by the first transistor Q1 (an NPN transistor) and the second transistor Q2 (a PNP transistor) that are connected is connected in series in the driving loop of the power device TR1.

Working principle: When the mechanical switch K1 is closed, load RL is powered, and voltage at two ends of the load RL recharges, by using the first current limiting element R1 and the unidirectional conduction device D1, the first capacitor C1 to approximately a regulated voltage value of the first voltage regulator Z1. During breaking of the mechanical switch K1, the first voltage detection switch (A1) is turned on when detecting that there is a potential difference between the two ends of the power device TR1 (in other words, is turned on when detecting disconnection of the mechanical switch K1 in real time). The first capacitor C1, the first voltage detection switch (A1), the second end (the trigger) of the power device TR1, and the third end (the first anode) of the power device TR1 form the driving loop, to drive the power device TR1 to be turned on. The power device TR1 is automatically turned off when a current passing through the first voltage detection switch (A1) is less than a minimum hold current of the first voltage detection switch (A1). That is, the first voltage detection switch (A1) quickly discharges the first capacitor C1 to a minimum conduction current of the first voltage detection switch (A1), and the power device TR1 is automatically turned off at a current zero point, thereby achieving objectives of arc extinguishing by driving the power device TR1 in real time and a short conduction time.

Figure 5:
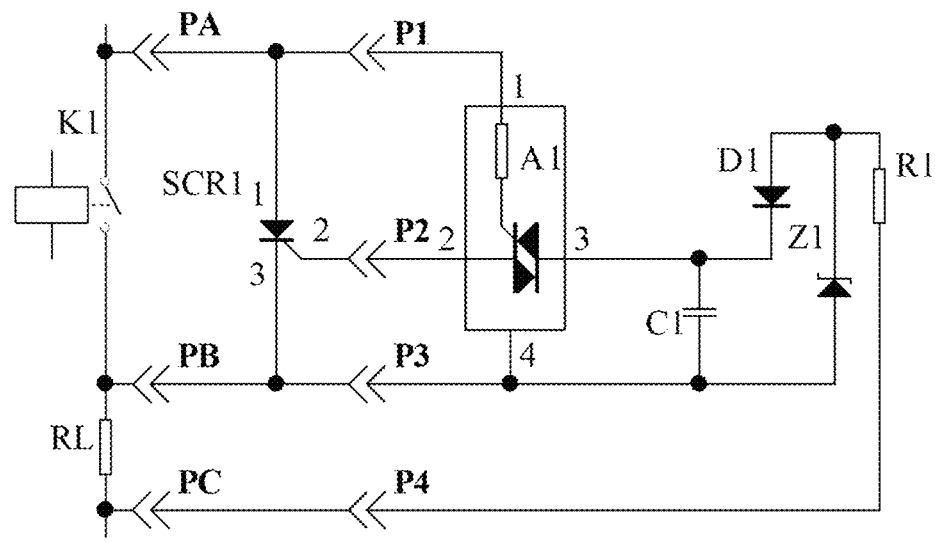
FIG. 5 is a schematic diagram 2 of a circuit of Embodiment 1 of an arc extinguishing power device driving apparatus and an arc extinguishing apparatus according to the present disclosure.
Figure 6:
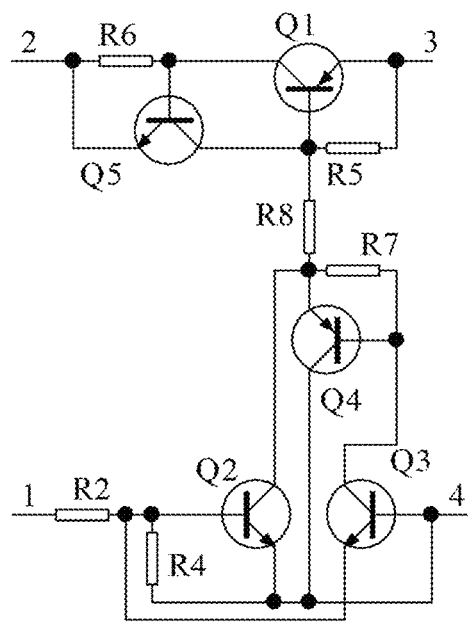
FIG. 6 is a schematic diagram 3 of a circuit of a first voltage detection switch of an arc extinguishing power device driving apparatus according to the present disclosure.
Figure 7:
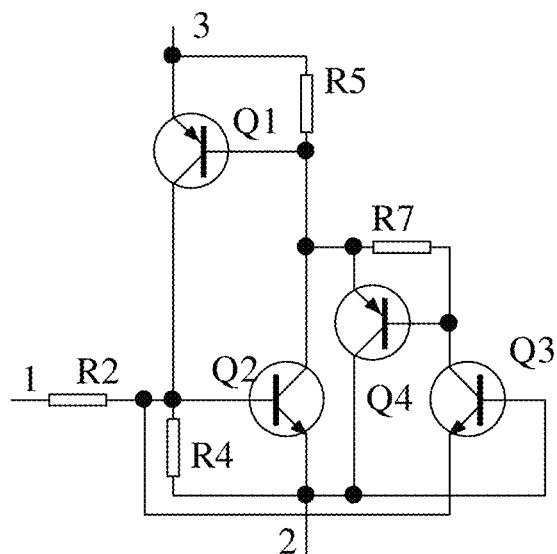
FIG. 7 is a schematic diagram 4 of a circuit of a first voltage detection switch of an arc extinguishing power device driving apparatus according to the present disclosure.

As shown in FIG. 2, the power device is a bidirectional thyristor. When a unidirectional thyristor is used, as shown in FIG. 5, only polarities of related devices need to be adjusted. For the first voltage detection switch (A1), refer to circuits shown in FIG. 6 and FIG. 7. A difference of the circuits shown in FIG. 6 and FIG. 7 from the circuits shown in FIG. 3 and FIG. 4 lies in that a related PNP transistor is replaced with an NPN transistor and an NPN transistor is replaced with a PNP transistor. A working principle is completely the same. When unidirectional transistors that are reversely connected in parallel are driven, only two driving apparatuses of the present disclosure are required. Because the first voltage detection switch (A1) is a full-wave voltage detection circuit, each time the mechanical switch K1 is broken for arc extinguishing, only one unidirectional thyristor needs to be turned on. For one of the arc extinguishing power device driving apparatuses of the present disclosure, when the mechanical switch K1 is in a normally open state, the first voltage detection switch (A1) retains a discharge state of the first capacitor C1, to prevent a power device corresponding to the first capacitor C1 from being turned on.

Figure 8:
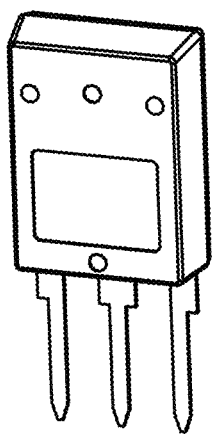
FIG. 8 is a schematic diagram 1 of a package of an arc extinguishing apparatus according to the present disclosure.

An arc extinguishing apparatus is provided, including the foregoing arc extinguishing power device driving apparatus, and further including the power device, a first pin, a second pin, and a third pin. The arc extinguishing power device driving apparatus and the power device are packaged in an insulating material. The first pin and the second pin are respectively connected to the first end of the power device and the third end of the power device. The third pin is connected to an end of the first current limiting element R1 (note: the end of the first current limiting element R1 is a location relative to the first capacitor C1) in the series circuit formed by the first current limiting element R1, the unidirectional conduction device D1, and the first capacitor C1. A schematic diagram of a package is shown in FIG. 8. The arc extinguishing apparatus has advantages of convenient use and easy promotion.

In the foregoing embodiment, before the mechanical switch K1 is disconnected, no driving energy needs to be provided for the power device in advance. The first voltage detection switch (A1) is used to detect disconnection of the mechanical switch K1 in real time, thereby greatly reducing a capacity requirement for the first capacitor C1, improving recharge and discharge speeds of the first capacitor C1, reducing an arc extinguishing response time of the electronic arc extinguishing apparatus, and reducing an arc extinguishing conduction time (the conduction time may be less than half a cycle) of the power device. A chip ceramic capacitor may be used as the first capacitor C1. The chip ceramic capacitor has a small volume, a low cost, and good temperature resistance performance, and therefore can satisfy an integrated plastic packaging process. In actual use, a current limiting resistor may be connected in series in a discharge circuit of the first capacitor C1. When necessary, a constant current circuit may be used for the first voltage detection switch (A1). In a 220 V AC system, to drive a thyristor of tens of amperes, the regulated voltage value of the first voltage regulator may be set to 20 V, a capacity of the first capacitor C1 may be set to 1-5 μF, and a resistance value of the first current limiting element R1 may be set to 330 kΩ (with a power consumption of only 0.147 W). A driving signal of the thyristor is directly provided by an AC power grid through current limiting by the first current limiting element R1, rectification by the unidirectional conduction device D1, and energy storage by the first capacitor C1. Advantages are as follows: Driving for the thyristor requires no trigger transformer and requires no high-voltage electronic switch, reliability is high, a circuit is simple, small space is occupied, and cost effectiveness is high. Especially when an alternating current has a zero point, no synchronization signal is required, and a three-end circuit with reduced wiring and convenient usage can be used to achieve an objective of fast and accurate arc extinguishing. The arc extinguishing apparatus using the arc extinguishing power device driving apparatus of the present disclosure may also be used for arc extinguishing for mechanical switches without a control coil, such as a button switch and a limiting switch, and has an advantage of a wide application scope.

Figure 9:
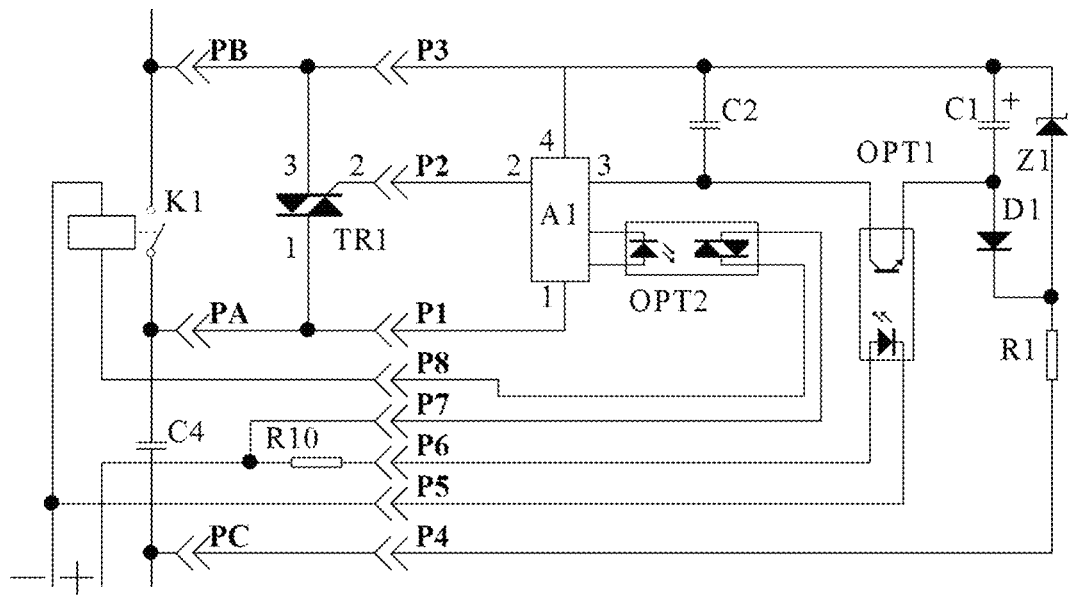
FIG. 9 is a schematic diagram of a circuit of Embodiment 2 of an arc extinguishing power device driving apparatus and an arc extinguishing apparatus according to the present disclosure.
Figure 10:
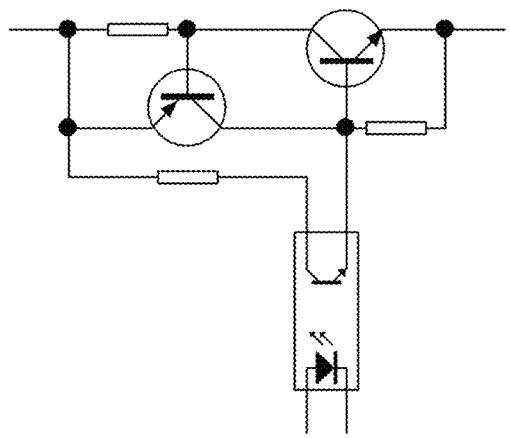
FIG. 10 is a schematic diagram of an optocoupler-driven thyristor equivalent circuit of an arc extinguishing power device driving apparatus according to the present disclosure.

Embodiment 2 of an arc extinguishing power device driving apparatus of the present disclosure is shown in FIG. 9:

An arc extinguishing power device driving apparatus is provided, where a power device TR1 (a bidirectional thyristor) that needs to be driven is connected in parallel to a mechanical switch K1 that requires arc extinguishing, and includes a first voltage detection switch (A1), a first current limiting element R1 (a resistor), a first capacitor C1, a unidirectional conduction device D1 (a diode), a first voltage regulator Z1 (a voltage regulation diode), a second capacitor C2, a first photoelectric switch OPT1, and a second photoelectric switch OPT2, where a control end of the first voltage detection switch (A1) is connected to a first end of the power device TR1; the first current limiting element R1, the unidirectional conduction device D1, and the first capacitor C1 are connected in series to form a series circuit; one end of the series circuit is connected to a power supply (the power supply may be a neutral line or another phase power supply relative to a third end of the power device TR1), and the other end of the series circuit is connected to the third end of the power device TR1; and the first voltage regulator Z1 is connected in parallel to the first capacitor C1 by using the unidirectional conduction device D1 (or the first voltage regulator Z1 may be directly connected in parallel to the first capacitor C1, but a voltage withstand requirement for the unidirectional conduction device D1 needs to be improved). The first capacitor C1, the first photoelectric switch OPT1, the first voltage detection switch (A1), the second end of the power device TR1, and the third end of the power device TR1 form a driving loop. A control end of the first photoelectric switch OPT1 is connected to a control end of the mechanical switch K1 by using a current limiting element R10. The second photoelectric switch OPT2 is an optocoupler with thyristor output, or may be an optocoupler-driven thyristor equivalent circuit shown in FIG. 10. A control end of the second photoelectric switch OPT2 is connected to the first voltage detection switch (A1). An output end of the second photoelectric switch OPT2 is connected in series to a control coil of the mechanical switch K1. Note: The first capacitor C1 and the second capacitor C2 are distinguished for ease of description, and may be defined in a cross manner in actual use. The first voltage detection switch (A1) may be a voltage zero-crossing detection switch.

Working principle: The power supply recharges, by using the first current limiting element R1 and the unidirectional conduction device D1, the first capacitor C1 to approximately a regulated voltage value of the first voltage regulator Z1. Before the mechanical switch K1 is closed, a control signal is input in the mechanical switch K1, the first photoelectric switch OPT1 is turned on, and an electric charge of the first capacitor C1 stores energy for the second capacitor C2 by using the first photoelectric switch OPT1. When the first voltage detection switch (A1) is turned on upon zero crossing, electric charges of the first capacitor C1 and the second capacitor C2 drive, by using the first photoelectric switch OPT1 and the first voltage detection switch (A1), the power device TR1 to be turned on, the second photoelectric switch OPT2 is turned on, the mechanical switch K1 is closed, and the first voltage detection switch (A1) is turned off. When the mechanical switch K1 is broken, the first photoelectric switch OPT1 is turned off, the first voltage detection switch (A1) is turned on, and the second capacitor C2 drives, by using the first voltage detection switch (A1), the power device TR1 to be turned on. The power device TR1 is automatically turned off when a current passing through the first voltage detection switch (A1) is less than a minimum hold current of the first voltage detection switch (A1), thereby achieving objectives of arc extinguishing by driving the power device TR1 in real time and a short conduction time of the power device TR1. This embodiment may be used for driving an electronic arc extinguishing apparatus, of a mechanical switch such as a relay, that requires zero-crossing connection. The second photoelectric switch OPT2 helps overcome a problem that the mechanical switch K1 is closed before zero-crossing conduction of the power device TR1. When an action speed of the mechanical switch K1 is greater than half a cycle, the second photoelectric switch OPT2 may be omitted. The first photoelectric switch OPT1 helps reduce a conduction time of the power device TR1 when the mechanical switch K1 is broken for arc extinguishing, and increase a secondary response speed of this apparatus. In addition, during zero-crossing connection, the two capacitors simultaneously provide driving energy for the power device TR1, thereby ensuring that the driving energy of the power device TR1 is not interrupted before the mechanical switch K1 is closed. An electric capacity of the second capacitor C2 is far greater than, that is, at least 10 times greater than, an electric capacity of the first capacitor C1. This embodiment may be implemented in an integrated manner depending on a requirement, and the second capacitor C2 may be disposed externally.

Figure 11:
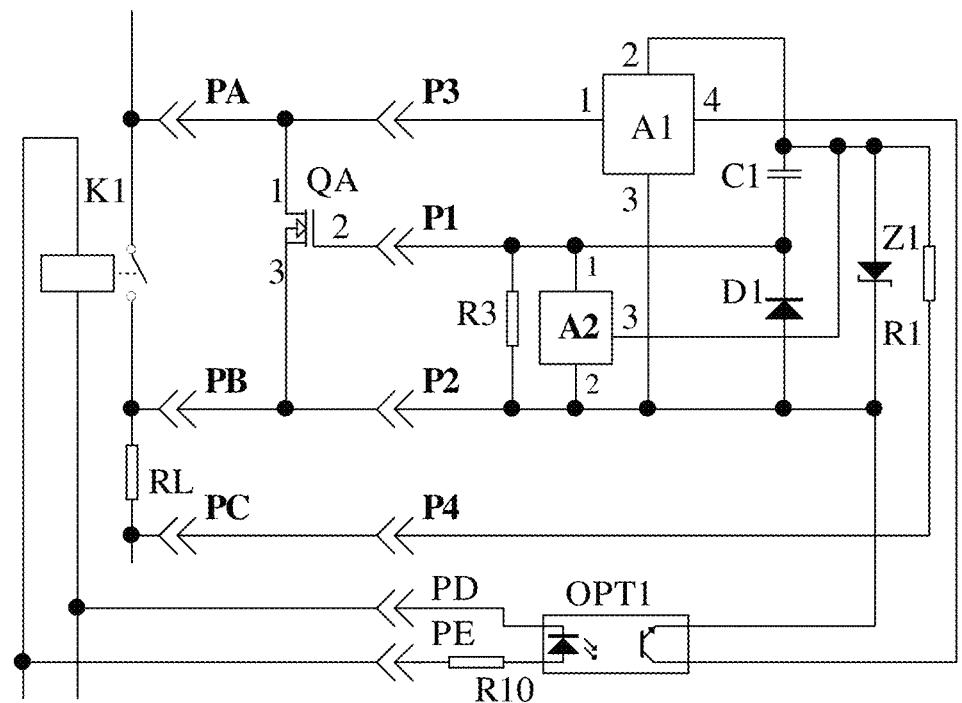
FIG. 11 is a schematic diagram of a circuit of Embodiment 3 of an arc extinguishing power device driving apparatus and an arc extinguishing apparatus according to the present disclosure.

Embodiment 3 of an arc extinguishing power device driving apparatus of the present disclosure is shown in FIG. 11:

An arc extinguishing power device driving apparatus is provided, where a power device QA (a field-effect transistor or a voltage-controlled device such as an IGBT) that needs to be driven is connected in parallel to a mechanical switch K1 that requires arc extinguishing, and includes a first voltage detection switch (A1), a second voltage detection switch (A2), an optocoupler OPT1, a first semiconductor switch D1 (a diode), a first current limiting element R1, a first capacitor C1, a first voltage regulator Z1 (a voltage regulation diode), and a third resistor R3, where the first voltage detection switch (A1), a second end of the power device QA, and a third end of the power device QA form a driving loop of the power device QA; a control end of the first voltage detection switch (A1) is connected to a first end of the power device QA; two ends of the second voltage detection switch (A2) are respectively connected to the second end of the power device QA and the third end of the power device QA; the second voltage detection switch (A2) and the first voltage detection switch (A1) are connected in series to form a first series circuit; a control end of the second voltage detection switch (A2) is connected to an end of the first voltage detection switch (A1) in the first series circuit; the second voltage detection switch (A2) is turned on when a voltage of a driving signal cannot satisfy saturated conduction of the power device QA; the optocoupler OPT1 is configured to enable the first voltage detection switch (A1); and a control end of the optocoupler OPT1 is connected to a control end of the mechanical switch K1. The first semiconductor switch D1, the first capacitor C1, and the first current limiting element R1 are sequentially connected in series to form a second series circuit. The second series circuit is connected in parallel to load RL of the mechanical switch K1. An end of the first semiconductor switch D1 of the second series circuit is connected to the third end of the power device QA. A common end of the first semiconductor switch D1 and the first capacitor C1 is connected to the second end of the power device QA. A third series circuit formed by the first semiconductor switch D1 and the first capacitor C1 that are connected in series is connected in parallel to the first voltage detection switch (A1). The first voltage regulator Z1 is connected in parallel to the first capacitor C1 by using the first semiconductor switch D1 (or the first voltage regulator Z1 may be directly connected in parallel to the first capacitor C1). A cathode of the first semiconductor switch D1 is connected to the first capacitor C1. If action frequency of the mechanical switch K1 is not high, the optocoupler OPT1 may be omitted. Two ends of the third resistor R3 are respectively connected to the second end of the power device QA and the third end of the power device QA, to provide a discharge channel for the first capacitor C1. The third resistor R3 may be omitted when the power device QA has a built-in resistor.

Figure 12:
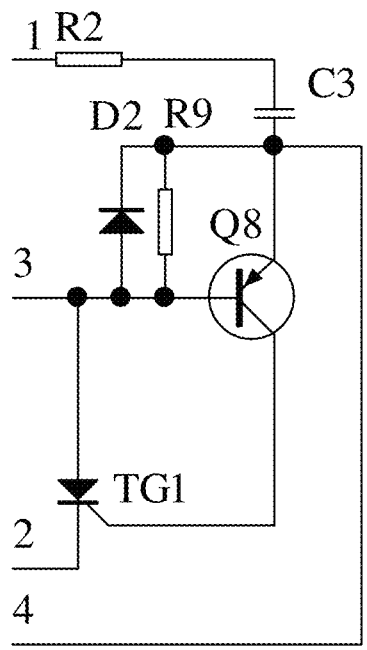
FIG. 12 is a schematic diagram 5 of a circuit of a first voltage detection switch of an arc extinguishing power device driving apparatus according to the present disclosure.
Figure 13:
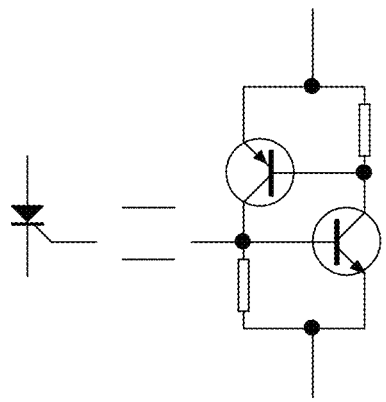
FIG. 13 is a schematic diagram of a thyristor equivalent circuit of an arc extinguishing power device driving apparatus according to the present disclosure.

First voltage detection switch (A1): As shown in FIG. 12, the first voltage detection switch (A1) includes a trigger switch TG1, an eighth transistor Q8, a third capacitor C3, a second resistor R2, a ninth resistor R9, and a diode D2. The trigger switch TG1 is connected in parallel to the third series circuit formed by the first semiconductor switch D1 and the first capacitor C1 that are connected in series. A potential difference signal between the third end of the power device QA and the first end of the power device QA is amplified by the second resistor R2, the third capacitor C3, and the eighth transistor Q8, and then transferred to a trigger of the trigger switch TG1. The ninth resistor R9 is connected in parallel to the diode D2. The diode D2 is reversely connected in parallel to a base of the eighth transistor Q8 and an emitter of the eighth transistor Q8. The second resistor R2 is used for current limiting. The ninth resistor R9 is used to improve an anti-interference capability of the circuit. The second resistor R2 and the ninth resistor R9 are used depending on a requirement. A thyristor or the thyristor equivalent circuit shown in FIG. 13 may be used as the trigger switch TG1.

Figure 14:
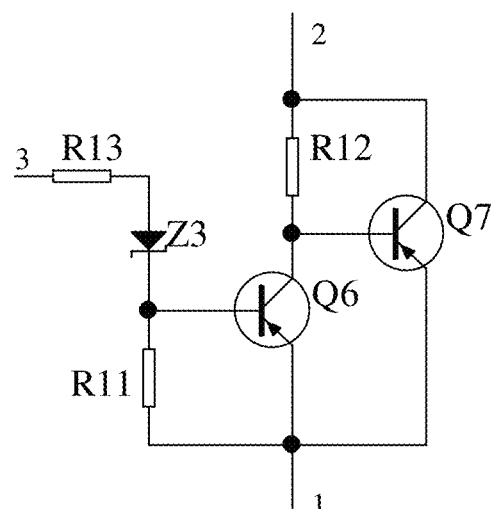
FIG. 14 is a schematic diagram 1 of a circuit of a second voltage detection switch of an arc extinguishing power device driving apparatus according to the present disclosure.

Second voltage detection switch (A2): As shown in FIG. 14, the second voltage detection switch (A2) includes resistors and transistors, including a third voltage regulator Z3, a sixth transistor Q6, a seventh transistor Q7, an eleventh resistor R11, a twelfth resistor R12, and a thirteenth resistor R13. A collector of the sixth transistor Q6 is connected to a base of the seventh transistor Q7. The collector of the sixth transistor Q6 is connected to a collector of the seventh transistor Q7 by using the twelfth resistor R12. The collector of the seventh transistor Q7 and an emitter of the seventh transistor Q7 are a main loop end of the second voltage detection switch (A2). The thirteenth resistor R13, the third voltage regulator Z3, a base of the sixth transistor Q6, and an emitter of the sixth transistor Q6 are connected in series to form a fourth series circuit. The fourth series circuit is connected in parallel to the first capacitor C1. Two ends of the eleventh resistor R11 are respectively connected to the base of the sixth transistor Q6 and the emitter of the sixth transistor Q6. The emitter of the sixth transistor Q6 is connected to the emitter of the seventh transistor Q7.

Figure 15:
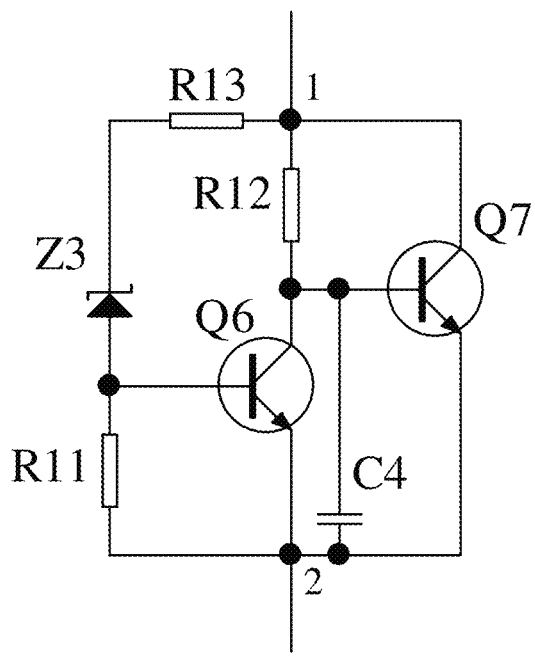
FIG. 15 is a schematic diagram 2 of a circuit of a second voltage detection switch of an arc extinguishing power device driving apparatus according to the present disclosure.

When a two-end circuit is used for the second voltage detection switch (A2), as shown in FIG. 15, the second voltage detection switch (A2) includes a third voltage regulator Z3, a sixth transistor Q6, a seventh transistor Q7, an eleventh resistor R11, a twelfth resistor R12, a thirteenth resistor R13, and a fourth capacitor C4. A collector of the sixth transistor Q6 is connected to a base of the seventh transistor Q7. The collector of the sixth transistor Q6 is connected to a collector of the seventh transistor Q7 by using the twelfth resistor R12. The collector of the seventh transistor Q7 and an emitter of the seventh transistor Q7 are a main loop end of the second voltage detection switch (A2). The thirteenth resistor R13, the third voltage regulator Z3, a base of the sixth transistor Q6, and an emitter of the sixth transistor Q6 are connected in series to form a series circuit. The series circuit is connected in parallel to the main loop end of the second voltage detection switch (A2) (in other words, is connected in parallel to the collector of the seventh transistor Q7 and the emitter of the seventh transistor Q7). Two ends of the eleventh resistor R11 are respectively connected to the base of the sixth transistor Q6 and the emitter of the sixth transistor Q6. The emitter of the sixth transistor Q6 is connected to the emitter of the seventh transistor Q7. Two ends of the fourth capacitor C4 are respectively connected to the base of the seventh transistor Q7 and the emitter of the seventh transistor Q7.

An arc extinguishing apparatus is provided, including the foregoing arc extinguishing power device driving apparatus (when the optocoupler OPT1 is omitted), and further including the power device QA, a first pin PA, a second pin PB, and a third pin PC. The arc extinguishing power device driving apparatus and the power device are packaged in an insulating material. The first pin PA and the second pin PB are respectively connected to the first end of the power device and the third end of the power device. The third pin PC is connected to an end of the first current limiting element R1 of the second series circuit. A schematic diagram of a package is shown in FIG. 8.

Figure 16:
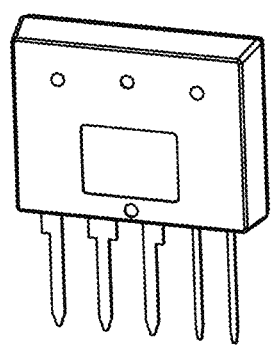
FIG. 16 is a schematic diagram 2 of a package of an arc extinguishing apparatus according to the present disclosure.

When the optocoupler OPT1 is included, a fourth pin PD and a fifth pin PE are further included. The first pin PA and the second pin PB are respectively connected to the first end of the power device and the third end of the power device. The third pin PC is connected to the end of the first current limiting element (an end of a power supply) of the second series circuit. The fourth pin PD and the fifth pin PE are connected to the control end of the optocoupler OPT1. A schematic diagram of a package is shown in FIG. 16.

Working principle: The mechanical switch K1 is powered and closed. The power supply recharges, by using the first current limiting element R1 and the first semiconductor switch D1, the first capacitor C1 to approximately a regulated voltage value of the first voltage regulator Z1. When the mechanical switch K1 is in a closed state, the first voltage detection switch (A1) is turned off, and the second voltage detection switch (A2) is turned off. When the mechanical switch K1 loses power, the optocoupler OPT1 is turned off, and the first voltage detection switch (A1) is enabled. When the first voltage detection switch (A1) detects that there is a potential difference between two ends of the power device QA (in other words, detects disconnection of the mechanical switch K1 in real time), the trigger switch TG1 triggers conduction. An electric charge of the first capacitor C1 is transferred to the power device QA by using the first voltage detection switch (A1), to drive the power device QA to be turned on. The second voltage detection switch (A2) is turned on when a voltage of a driving signal cannot satisfy saturated conduction of the power device QA, to accelerate discharge of the first capacitor C1. The power device QA is quickly turned off, thereby achieving an objective of arc extinguishing by driving conduction of the power device QA in real time.

The arc extinguishing power device driving apparatus in this embodiment has the following advantages:

The second voltage detection switch (A2) is configured to prevent the power device from working in an amplification area, to improve an overload capability of a power tube and reduce a temperature rise. A discharge speed of the first capacitor C1 and a cutoff speed of the second voltage detection switch (A2) are improved, to improve a response speed of the arc extinguishing apparatus. The power device QA is used for direct current arc extinguishing. The first capacitor C1 is recharged by using a diode connected in series, that is, by using a manner in which the third series circuit formed by the first semiconductor switch D1 and the first capacitor C1 that are connected in series is connected in parallel to the first voltage detection switch (A1). Current pull-up of the first capacitor C1 is used to drive the power device QA to be turned on. This facilitates driving of an NPN triode, an N-channel field-effect transistor, and an IGBT whose load is connected to a negative electrode. In addition, capacitor (the third capacitor C3) coupling is used in the first voltage detection switch (A1). When the mechanical switch K1 is in a disconnected state, power consumption of the first voltage detection switch (A1) is zero, thereby facilitating use in a place such as a car. In addition, the arc extinguishing apparatus using the arc extinguishing power device driving apparatus of the present disclosure may require no synchronization signal, and may also be used for arc extinguishing for mechanical switches without a control coil, such as a button switch, a rocker switch, and a limiting switch, and has an advantage of a wide application scope.

Figure 17:
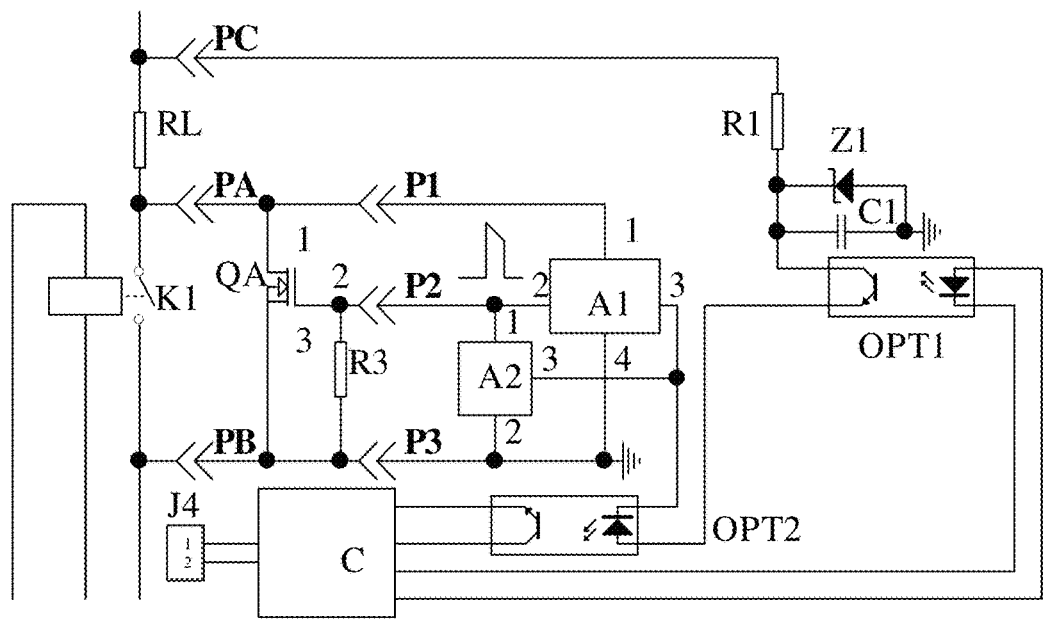
FIG. 17 is a schematic diagram of a circuit of Embodiment 4 of an arc extinguishing apparatus according to the present disclosure.

Embodiment 4 of an arc extinguishing power device driving apparatus of the present disclosure is shown in FIG. 17:

An arc extinguishing power device driving apparatus is provided, where a power device QA (a field-effect transistor or a voltage-controlled device such as an IGBT) that needs to be driven is connected in parallel to a mechanical switch K1 that requires arc extinguishing, and includes a first voltage detection switch (A1), a second voltage detection switch (A2), a first current limiting element R1, a first capacitor C1, a first voltage regulator Z1 (a voltage regulation diode), a third resistor R3, a control unit (C), a first optocoupler OPT1, and a second optocoupler OPT2. A control end of the first voltage detection switch (A1) is connected to a first end of the power device QA. Two ends of the second voltage detection switch (A2) are respectively connected to a second end of the power device QA and a third end of the power device QA. The second voltage detection switch (A2) and the first voltage detection switch (A1) are connected in series to form a first series circuit. A control end of the second voltage detection switch (A2) is connected to an end of the first voltage detection switch (A1) in the first series circuit. An output end of the first optocoupler OPT1 and a control end of the second optocoupler OPT2 are connected to the first voltage detection switch (A1). A driving power supply of the first optocoupler OPT1 and the power device QA is provided by a PC-end power supply by using the first current limiting element R1 and through energy storage by the first capacitor C1. An output signal of the second optocoupler OPT2 is transferred to the control unit (C). A control end of the first optocoupler OPT1 is connected to the control unit (C). The first voltage regulator Z1 is connected in parallel to the first capacitor C1. Two ends of the third resistor R3 are respectively connected to the second end of the power device QA and the third end of the power device QA, to provide a discharge channel for the first capacitor C1. The third resistor R3 may be omitted when the power device QA has a built-in resistor. Note: As shown in FIG. 17, the output end of the first optocoupler OPT1, the control end of the second optocoupler OPT2, and the first voltage detection switch (A1) are connected in series in a driving loop of the power device QA. In actual application, the output end of the first optocoupler OPT1 and the control end of the second optocoupler OPT2 may also be connected to an internal circuit of the first voltage detection switch (A1).

Working principle: This apparatus is powered. The power supply recharges, by using the first current limiting element R1, the first capacitor C1 to approximately a regulated voltage value of the first voltage regulator Z1. When the mechanical switch K1 is in a closed state, the first voltage detection switch (A1) is turned off, and the second voltage detection switch (A2) is turned off. When the mechanical switch K1 loses power, the first voltage detection switch (A1) is turned on when detecting that there is a potential difference between two ends of the power device QA (in other words, detecting disconnection of the mechanical switch K1 in real time). An electric charge of the first capacitor C1 is transferred to the power device QA by using the first optocoupler OPT1, the control end of the second optocoupler OPT2, and the first voltage detection switch (A1), to drive the power device QA to be turned on. The output signal of the second optocoupler OPT2 is transferred to the control unit (C). The control unit (C) controls, by using the first optocoupler OPT1, the first capacitor C1 to stop discharging. The second voltage detection switch (A2) is turned on when a voltage of a driving signal cannot satisfy saturated conduction of the power device QA, to discharge a junction capacitor of the power device QA. The power device QA is quickly turned off, thereby achieving objectives of arc extinguishing by driving the power device QA in real time and a short conduction time of the power device QA. Note: The second voltage detection switch (A2) may be omitted when the power device QA is a thyristor.

In this embodiment, the first voltage detection switch (A1) is used to drive and control the power device QA to be turned on in real time for arc extinguishing, the second optocoupler OPT2 feeds back a signal to the control unit (C), and then the control unit (C) controls, by using the first optocoupler OPT1, the power device QA to be turned off. Advantages are as follows: The power device QA has a high arc extinguishing speed, and requires a short conduction time for arc extinguishing.

In the foregoing embodiments, depending on a requirement, a capacitor may be connected in series to a resistor, or a capacitor may be connected in series to a constant current circuit, or a driving end of a semi-controllable or fully-controllable device such as a power device may be connected in series or in parallel to a resistor. In the present disclosure, pins are not marked in a schematic diagram of a package, because a pin arrangement sequence and a connection relationship between the pins and a corresponding circuit may be randomly arranged depending on a process and an external accessory product. In addition, an outline of a package is not limited, and an existing conventional package outline and pin manner may be adopted.

To sum up, in the present disclosure, the first voltage detection switch monitors disconnection of the mechanical switch in real time. This can greatly reduce the driving energy required for driving the power device. Control energy of the first voltage detection switch is provided by the two ends of the power device. There is no insulated isolation between an input loop of the first voltage detection switch (A1), an output loop of the first voltage detection switch (A1), and the power device. This contributes to advantages of a low cost and a small volume. In the embodiments of the present disclosure, the driving energy is provided in a non-isolated manner by a power grid in which the power device is located. The power device is driven to be turned on in a manner in which the capacitor stores energy and the capacitor is discharged by using the first voltage detection switch (which monitors disconnection of the mechanical switch in real time). A capacity requirement for the capacitor is low (only several μFs). A chip ceramic capacitor may be used as the capacitor. This contributes to advantages of a simple circuit, low power consumption, a low cost, a high response speed, a short conduction time of the power device, and easy integration. An integrated arc extinguishing power device driving integrated circuit may be generated, thereby facilitating promotion of an electronic arc extinguishing technology. In addition, the arc extinguishing apparatus using the arc extinguishing power device driving apparatus of the present disclosure requires no synchronization signal when zero-crossing connection is not required, may be used for arc extinguishing for mechanical switches without a control coil, such as a button switch and a limiting switch, and has an advantage of a wide application scope. A power device arc extinguishing apparatus included in the present disclosure has advantages of a small volume and convenient use.

What is claimed is:

1. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device;
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device; and
there is no insulated isolation between an input loop of the first voltage detection switch, an output loop of the first voltage detection switch, and the power device.

2. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device;
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device;
the first voltage detection switch comprises a second current limiting element and a semiconductor switch,
the second current limiting element is configured to transfer a potential difference signal between the two ends of the power device to a control end of the semiconductor switch,
the semiconductor switch is connected in series in the driving loop, and
the second current limiting element is a resistor or a capacitor.

3. The arc extinguishing power device driving apparatus according to claim 2, wherein the semiconductor switch is a circuit of a transistor-driven thyristor equivalent circuit, or a thyristor equivalent circuit, or a thyristor.

4. The arc extinguishing power device driving apparatus according to claim 3, wherein the thyristor equivalent circuit or the thyristor is connected in series in the driving loop.

5. The arc extinguishing power device driving apparatus according to claim 4, wherein the thyristor equivalent circuit comprises a PNP transistor and an NPN transistor, a base of the PNP transistor is connected to a collector of the NPN transistor, a collector of the PNP transistor is connected to a base of the NPN transistor, and an emitter of the PNP transistor and an emitter of the NPN transistor are connected in series in the driving loop.

6. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device;
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device;
the arc extinguishing power device driving apparatus further comprises a first capacitor,
a control end of the first voltage detection switch is connected to a first end of the power device;
the first capacitor, the first voltage detection switch, and a second end and a third end of the power device form the driving loop; and
the first capacitor is connected to a switch configured to recharge the first capacitor or a first current limiting element.

7. The arc extinguishing power device driving apparatus according to claim 6, wherein the first voltage detection switch discharges the first capacitor to a minimum conduction current of the first voltage detection switch.

8. The arc extinguishing power device driving apparatus according to claim 6, wherein the power device is a unidirectional thyristor or a bidirectional thyristor, and the arc extinguishing power device driving apparatus further comprises a unidirectional conduction device and a first voltage regulator; the first current limiting element, the unidirectional conduction device, and the first capacitor are connected in series to form a series circuit; one end of the series circuit is connected to a power supply, and the other end of the series circuit is connected to the third end of the power device; the first capacitor, the first voltage detection switch, the second end of the power device, and the third end of the power device form the driving loop; and the first voltage regulator is connected in parallel to the first capacitor, or the first voltage regulator is connected in parallel to the first capacitor by using the unidirectional conduction device.

9. The arc extinguishing power device driving apparatus according to claim 8, wherein the first voltage detection switch is a full-wave voltage detection circuit.

10. The arc extinguishing power device driving apparatus according to claim 8, wherein the power supply is provided in a non-isolated manner by a power grid in which the power device is located.

11. The arc extinguishing power device driving apparatus according to claim 8, wherein the power supply is a neutral line or another phase power supply relative to the third end of the power device.

12. The arc extinguishing power device driving apparatus according to claim 8, further comprising a second capacitor and a first photoelectric switch, wherein the first voltage detection switch is a voltage zero-crossing detection switch; the first capacitor, the first photoelectric switch, the first voltage detection switch, the second end of the power device, and the third end of the power device form the driving loop; before the mechanical switch is closed, the first photoelectric switch is turned on, and an electric charge of the first capacitor stores energy for the second capacitor by using the first photoelectric switch; when the first voltage detection switch is turned on, the electric charge of the first capacitor drives, by using the first photoelectric switch and the first voltage detection switch, the power device to be turned on; then the mechanical switch is closed, and the first voltage detection switch is turned off; and when the mechanical switch is broken, the first photoelectric switch is turned off, the first voltage detection switch is turned on, and the second capacitor drives, by using the first voltage detection switch, the power device to be turned on.

13. The arc extinguishing power device driving apparatus according to claim 12, wherein a control end of the first photoelectric switch is connected to a control end of the mechanical switch by using a current limiting element.

14. The arc extinguishing power device driving apparatus according to claim 12, comprising a second photoelectric switch, wherein the second photoelectric switch is an optocoupler with thyristor output or an optocoupler-driven thyristor equivalent circuit, a control end of the second photoelectric switch is connected to the first voltage detection switch, and an output end of the second photoelectric switch is connected in series to a control coil of the mechanical switch.

15. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device:
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device;
the power device is a thyristor;
the first voltage detection switch comprises a second current limiting element, a first transistor, a second transistor, a third transistor, and a fourth transistor;
an emitter of the second transistor is connected to a base of the third transistor;
a base of the second transistor is connected to an emitter of the third transistor;
a collector of the second transistor is connected to a base of the first transistor;
a base of the fourth transistor is connected to a collector of the third transistor;
a collector of the fourth transistor is connected to the emitter of the second transistor;
an emitter of the fourth transistor is connected to the base of the first transistor;
the base of the second transistor is connected to a first end of the power device by using the second current limiting element;
the emitter of the second transistor is connected to a third end of the power device; and
an emitter of the first transistor and a collector of the first transistor are connected in series in the driving loop.

16. The arc extinguishing power device driving apparatus according to claim 15, further comprising a fifth transistor, wherein a base of the fifth transistor is connected to the collector of the first transistor, a collector of the fifth transistor is connected to the base of the first transistor, and an emitter of the fifth transistor is connected in series in the driving loop.

17. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device;
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device;
the power device is a thyristor;
the first voltage detection switch comprises a second current limiting element, a first transistor, a second transistor, a third transistor, and a fourth transistor;
an emitter of the second transistor is connected to a base of the third transistor;
a base of the second transistor is connected to an emitter of the third transistor;
a collector of the second transistor is connected to a base of the first transistor;
a base of the fourth transistor is connected to a collector of the third transistor;
a collector of the fourth transistor is connected to the emitter of the second transistor;
an emitter of the fourth transistor is connected to the base of the first transistor;

the base of the second transistor is connected to a first end of the power device by using the second current limiting element;
a collector of the first transistor is connected to the base of the second transistor;
the emitter of the second transistor is connected to a second end of the power device; and
an emitter of the first transistor and the emitter of the second transistor are connected in series in the driving loop of the power device.

18. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device:
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device;
the arc extinguishing power device driving apparatus further comprises a second voltage detection switch,
the first voltage detection switch, a second end of the power device, and a third end of the power device form the driving loop of the power device;
a control end of the first voltage detection switch is connected to a first end of the power device; and
two ends of the second voltage detection switch are respectively connected to the second end of the power device and the third end of the power device.

19. The arc extinguishing power device driving apparatus according to claim 18, wherein the second voltage detection switch and the first voltage detection switch are connected in series to form a first series circuit, and a control end of the second voltage detection switch is connected to an end of the first voltage detection switch in the first series circuit.

20. The arc extinguishing power device driving apparatus according to claim 18, wherein the second voltage detection switch is turned on when a voltage of the driving signal cannot satisfy saturated conduction of the power device.

21. The arc extinguishing power device driving apparatus according to claim 18, wherein the second voltage detection switch comprises a resistor and a transistor.

22. The arc extinguishing power device driving apparatus according to claim 18, wherein the second voltage detection switch comprises a third voltage regulator, a sixth transistor, a seventh transistor, an eleventh resistor, a twelfth resistor, and a thirteenth resistor; a collector of the sixth transistor is connected to a base of the seventh transistor; the collector of the sixth transistor is connected to a collector of the seventh transistor by using the twelfth resistor; the collector of the seventh transistor and an emitter of the seventh transistor are a main loop end of the second voltage detection switch; the thirteenth resistor, the third voltage regulator, a base of the sixth transistor, and an emitter of the sixth transistor are connected in series to form a fourth series circuit; the fourth series circuit is connected in parallel to a first capacitor; two ends of the eleventh resistor are respectively connected to the base of the sixth transistor and the emitter of the sixth transistor; and the emitter of the sixth transistor is connected to the emitter of the seventh transistor.

23. The arc extinguishing power device driving apparatus according to claim 18, wherein the second voltage detection switch comprises a third voltage regulator, a sixth transistor, a seventh transistor, an eleventh resistor, a twelfth resistor, a thirteenth resistor, and a fourth capacitor; a collector of the sixth transistor is connected to a base of the seventh transistor; the collector of the sixth transistor is connected to a collector of the seventh transistor by using the twelfth resistor; the collector of the seventh transistor and an emitter of the seventh transistor are a main loop end of the second voltage detection switch; the thirteenth resistor, the third voltage regulator, a base of the sixth transistor, and an emitter of the sixth transistor are connected in series to form a series circuit; the series circuit is connected in parallel to the main loop end of the second voltage detection switch; two ends of the eleventh resistor are respectively connected to the base of the sixth transistor and the emitter of the sixth transistor; the emitter of the sixth transistor is connected to the emitter of the seventh transistor; and two ends of the fourth capacitor are respectively connected to the base of the seventh transistor and the emitter of the seventh transistor.

24. The arc extinguishing power device driving apparatus according to claim 18, comprising a first semiconductor switch, a first current limiting element, and a first capacitor, wherein the first semiconductor switch, the first capacitor, and the first current limiting element are sequentially connected in series to form a second series circuit; the second series circuit is connected in parallel to load of the mechanical switch; an end of the first semiconductor switch in the second series circuit is connected to the third end of the power device; a common end of the first semiconductor switch and the first capacitor is connected to the second end of the power device; and a third series circuit formed by the first semiconductor switch and the first capacitor that are connected in series is connected in parallel to the first voltage detection switch.

25. The arc extinguishing power device driving apparatus according to claim 24, comprising a first voltage regulator, wherein the first voltage regulator is connected in parallel to the first capacitor, or the first voltage regulator is connected in parallel to the first capacitor by using the first semiconductor switch.

26. The arc extinguishing power device driving apparatus according to claim 24, wherein the first semiconductor switch is a diode, a cathode of the diode is connected to the first capacitor, and the power device is used for direct current arc extinguishing.

27. The arc extinguishing power device driving apparatus according to claim 24, wherein the first voltage detection switch comprises a trigger switch, a transistor, and a third capacitor; the trigger switch is connected in parallel to the third series circuit; a potential difference signal between the third end of the power device and the first end of the power device is amplified by the third capacitor and the transistor and then transferred to a trigger of the trigger switch.

28. The arc extinguishing power device driving apparatus according to claim 27, wherein the trigger switch is a thyristor or a thyristor equivalent circuit.

29. The arc extinguishing power device driving apparatus according to claim 24, further comprising an optocoupler, wherein the optocoupler is configured to enable the first voltage detection switch, and a control end of the optocoupler is connected to a control end of the mechanical switch.

30. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device;
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device;
the arc extinguishing power device driving apparatus further comprises a control unit, a first optocoupler, and a second optocoupler,
an output end of the first optocoupler and a control end of the second optocoupler are connected to the first voltage detection switch,
an output signal of the second optocoupler is connected to the control unit, and
a control end of the first optocoupler is connected to the control unit.

31. The arc extinguishing power device driving apparatus according to claim 18, wherein the power device is a voltage-controlled device.

32. The arc extinguishing power device driving apparatus according to claim 31, wherein the power device is a field-effect transistor or an IGBT.

33. An arc extinguishing power device driving apparatus, wherein a power device that needs to be driven is connected in parallel to a mechanical switch that requires arc extinguishing, the arc extinguishing power device driving apparatus comprising:
a first voltage detection switch, wherein:
an input end of the first voltage detection switch is connected to two ends of the power device;
the first voltage detection switch is connected in series in a driving loop of the power device;
the first voltage detection switch is configured to turn on when detecting that there is a potential difference between the two ends of the power device;
the first voltage detection switch is configured to transfer a driving signal to the power device to drive the power device to be turned on;
the first voltage detection switch is a semi-controllable switch, or a fully-controllable switch whose threshold is less than an on-state voltage of the power device;
the power device is configured for direct current arc extinguishing, and
the arc extinguishing power device driving apparatus further comprises a first semiconductor switch, a first current limiting element, and a first capacitor;
the first semiconductor switch, the first capacitor, and the first current limiting element are sequentially connected in series to form a second series circuit;
the second series circuit is connected in parallel to load of the mechanical switch;
an end of the first semiconductor switch in the second series circuit is connected to a third end of the power device;
a common end of the first semiconductor switch and the first capacitor is connected to a second end of the power device; and
a third series circuit formed by the first semiconductor switch and the first capacitor that are connected in series is connected in parallel to the first voltage detection switch.

34. The arc extinguishing power device driving apparatus according to claim 33, wherein the first voltage detection switch comprises a trigger switch, a transistor, and a third capacitor; the trigger switch is connected in parallel to the third series circuit; a potential difference signal between the third end of the power device and a first end of the power device is amplified by the third capacitor and the transistor and then transferred to a trigger of the trigger switch.

35. The arc extinguishing power device driving apparatus according to claim 34, wherein the trigger switch is a thyristor or a thyristor equivalent circuit.

36. The arc extinguishing power device driving apparatus according to claim 33, wherein the first semiconductor switch is a diode, and a cathode of the diode is connected to the first capacitor.

37. The arc extinguishing power device driving apparatus according to claim 33, comprising a first voltage regulator, wherein the first voltage regulator is connected in parallel to the first capacitor, or the first voltage regulator is connected in parallel to the first capacitor by using the first semiconductor switch.

38. The arc extinguishing power device driving apparatus according to claim 33, further comprising a second voltage detection switch, wherein
the first voltage detection switch, the second end of the power device, and the third end of the power device form the driving loop of the power device;
a control end of the first voltage detection switch is connected to a first end of the power device; and
two ends of the second voltage detection switch are respectively connected to the second end of the power device and the third end of the power device, and the second voltage detection switch is turned on when a voltage of the driving signal cannot satisfy saturated conduction of the power device.

39. The arc extinguishing power device driving apparatus according to claim 38, wherein the power device is a voltage-controlled device.

40. The arc extinguishing power device driving apparatus according to claim 38, wherein the power device is a field-effect transistor or an IGBT.

41. The arc extinguishing power device driving apparatus according to claim 33, further comprising an optocoupler, wherein the optocoupler is configured to enable the first voltage detection switch, and a control end of the optocoupler is connected to a control end of the mechanical switch.

42. An arc extinguishing apparatus, comprising the arc extinguishing power device driving apparatus according to claim 8, and further comprising the power device, a first pin, a second pin, and a third pin, wherein the arc extinguishing power device driving apparatus and the power device are packaged in an insulating material, the first pin and the second pin are respectively connected to the first end of the power device and the third end of the power device, and the third pin is connected to an end of the first current limiting element in the series circuit.

43. An arc extinguishing apparatus, comprising the arc extinguishing power device driving apparatus according to claim 24, and further comprising the power device, a first pin, a second pin, and a third pin, wherein the arc extinguishing power device driving apparatus and the power device are packaged in an insulating material, the first pin and the second pin are respectively connected to the first end of the power device and the third end of the power device, and the third pin is connected to an end of the first current limiting element in the second series circuit.

44. An arc extinguishing apparatus, comprising the arc extinguishing power device driving apparatus according to claim 29, and further comprising the power device, a first pin, a second pin, a third pin, a fourth pin, and a fifth pin, wherein the optocoupler, the arc extinguishing power device driving apparatus, and the power device are packaged in an insulating material; the first pin and the second pin are respectively connected to the first end of the power device and the third end of the power device; the third pin is connected to an end of the first current limiting element in the second series circuit; and the fourth pin and the fifth pin are connected to the control end of the optocoupler.

45. An arc extinguishing apparatus, comprising the arc extinguishing power device driving apparatus according to claim 33, and further comprising the power device, a first pin, a second pin, and a third pin, wherein the arc extinguishing power device driving apparatus and the power device are packaged in an insulating material, the first pin and the second pin are respectively connected to the first end of the power device and the third end of the power device, and the third pin is connected to an end of the first current limiting element in the second series circuit.

46. An arc extinguishing apparatus, comprising the arc extinguishing power device driving apparatus according to claim 41, and further comprising the power device, a first pin, a second pin, a third pin, a fourth pin, and a fifth pin, wherein the optocoupler, the arc extinguishing power device driving apparatus, and the power device are packaged in an insulating material; the first pin and the second pin are respectively connected to the first end of the power device and the third end of the power device; the third pin is connected to an end of the first current limiting element in the second series circuit; and the fourth pin and the fifth pin are connected to the control end of the optocoupler.

* * * * *